United States Patent
Lee et al.

(10) Patent No.: US 8,539,287 B2
(45) Date of Patent: Sep. 17, 2013

(54) METHOD FOR TRANSMITTING CONTROL INFORMATION IN WIRELESS COMMUNICATION SYSTEM

(75) Inventors: Young Sub Lee, Anyang-si (KR); Suk Woo Lee, Anyang-si (KR); Min Seok Oh, Anyang-si (KR)

(73) Assignee: LG Electronics Inc., Seoul (KR)

( * ) Notice: Subject to any disclaimer, the term of this patent is extended or adjusted under 35 U.S.C. 154(b) by 459 days.

(21) Appl. No.: 12/864,820

(22) PCT Filed: Feb. 5, 2009

(86) PCT No.: PCT/KR2009/000572
§ 371 (c)(1),
(2), (4) Date: Jul. 27, 2010

(87) PCT Pub. No.: WO2009/099308
PCT Pub. Date: Aug. 13, 2009

(65) Prior Publication Data
US 2010/0313098 A1    Dec. 9, 2010

(30) Foreign Application Priority Data
Feb. 5, 2008 (KR) .................. 10-2008-0011903

(51) Int. Cl.
*G06F 11/00* (2006.01)

(52) U.S. Cl.
USPC ............................................. 714/701

(58) Field of Classification Search
USPC ............................................. 714/701
See application file for complete search history.

(56) References Cited

U.S. PATENT DOCUMENTS

| | | | | |
|---|---|---|---|---|
| 5,668,925 A | * | 9/1997 | Rothweiler et al. | 704/220 |
| 6,738,942 B1 | * | 5/2004 | Sridharan et al. | 714/755 |
| 6,823,488 B1 | * | 11/2004 | Heegard et al. | 714/786 |
| 7,145,964 B2 | * | 12/2006 | Hoffmann et al. | 375/298 |
| 7,409,626 B1 | * | 8/2008 | Schelstraete | 714/774 |
| 7,519,124 B2 | * | 4/2009 | Oksman et al. | 375/260 |
| 7,904,779 B2 | * | 3/2011 | Belogolovy et al. | 714/751 |
| 8,023,532 B2 | * | 9/2011 | Rainish | 370/479 |
| 8,069,388 B2 | * | 11/2011 | Betts | 714/755 |
| 8,151,174 B2 | * | 4/2012 | Betts | 714/786 |
| 2004/0160943 A1 | | 8/2004 | Cain | |
| 2009/0031185 A1 | * | 1/2009 | Xhafa et al. | 714/751 |

OTHER PUBLICATIONS

Alok Gupta, "FEC Parameterization for Control Channel Information", Ensemble Communications, Inc., IEEE 802,16.1c-00/06, pp. 1-8, Sep. 10, 2000.

* cited by examiner

*Primary Examiner* — Amine Riad
(74) *Attorney, Agent, or Firm* — Birch, Stewart, Kolasch & Birch, LLP

(57) ABSTRACT

A method for transmitting control information in a wireless communication system is provided. A codeword is generated by performing forward error correction (FEC) encoding on control information to generate. An interleaved code is generated by interleaving the codeword. A combined code is generated by combining the codeword and the interleaved code. A transport block is generated by repeating the combined code and is transmitted.

6 Claims, 4 Drawing Sheets

METHOD FOR TRANSMITTING CONTROL INFORMATION IN WIRELESS COMMUNICATION SYSTEM

TECHNICAL FIELD

The present invention relates to wireless communication and, more particularly, to a method for transmitting control information in a wireless communication system.

BACKGROUND ART

IEEE (Institute of Electrical and Electronics Engineers) 802.16 standards provide techniques and protocols to support a broadband wireless access. Standardization proceeded starting from 1999 and IEEE 802.16-2001 was approved in 2001. It is based on a single carrier physical layer called 'WirelessMAN-SC'. Later, besides the 'WirelessMAN-SC', 'WirelessMAN-OFDM' and 'WirelessMAN-OFDMA' were added to the physical layer in IEEE 802.16a standards approved in 2003. After the IEEE 802.16a standards were completed, revised IEEE 802.16-2004 standards were approved in 2004. IEEE 802.16-2004/Cor1 (referred to as 'IEEE 802.16e', hereinafter) was finalized in the form of 'corrigendum' in 2005 in order to resolve and correct bugs and errors of the IEEE 802.16-2004 standards.

In a wireless communication system, control information with a size of relatively short information bits within tens of bits is exchanged between a transmitter and a receiver. Control information used in IEEE 802.16 standards includes a channel descriptor message defining the characteristics of a physical channel, a DL-MAP message defining an access to a downlink channel, a frame prefix including coding-related information of the DL-MAP message, and the like. An error generated during transmission of the control information may fatally affect reception of data. For example, if a transmission error is generated at the frame prefix, the DL-MAP message could not be decoded or an error would be generated for decoding of the DL-MAP message. Then, the receiver could not access downlink information or would access erroneous downlink information. Therefore, the control information should be transmitted with high reliability so that it may not affect system performance.

FIG. 1 illustrates an encoding process of the frame prefix based on the IEEE 802.16-2004 standards.

With reference to FIG. 1, a frame prefix of 24 bits is duplicated to form a block of 48 bits. The 48-bit block is subject to forward error correction (FEC) coding at a code rate of 1/2 to form a codeword of 96 bits. The codeword is subject to repetition coding four times to form a transport block of 384 bits. The 384-bit transport block is modulated and transmitted.

Duplicating the frame prefix before processing FEC coding is known to have a lower performance gain compared with repeating the codeword. In order to decode the duplicated frame prefix, generally, values obtained through soft-decision are combined to determine a value to be decoded, which, however, goes through a relatively complicated process compared with a Viterbi algorithm, a general convolutional code decoding method.

Thus, a method for effectively transmitting the control information which has a relatively short size and needs to be properly and accurately transmitted is required.

DISCLOSURE OF INVENTION

Technical Problem

The present invention provides a method for transmitting control information in a wireless communication system.

Technical Solution

In an aspect, a method for transmitting control information in a wireless communication system is provided. The method includes performing forward error correction (FEC) encoding on control information to generate a codeword, interleaving the codeword to generate an interleaved code, combining the codeword and the interleaved code to generate a combined code, repeating the combined code to generate a transport block, and transmitting the transport block.

In some embodiments, the interleaved code may be generated by interleaving a portion of the codeword. The interleaved code may be generated by interleaving the entirety of the codeword. The transport block may be generated by repeating the combined code at least two times.

In another aspect, a data processing apparatus includes a forward error correction (FEC) encoder 310 configured to encode transmission bits by using an FEC code to generate a codeword, an interleaver configured to interleaves a portion or the entirety of the codeword to generate a interleaved code, a first combining unit configured to combine a portion or the entirety of the codeword and a portion or the entirety of the interleaved code to generate a first combined code, a repetition unit configured to generate a repeated code by repeating the portion or the entirety of the first combined code, and a second combining unit configured to combines a portion or the entirety of the first combined code and a portion or the entirety of the repeated code to generate a transport block.

Advantageous Effects

Control information with a relatively short length of information bits can be transmitted with high reliability by using the same radio resources. Also, a smaller capacity of memory can be used for implementation and the complexity of a receiver can be reduced.

MODE FOR THE INVENTION

The technology described hereinafter may be used for various wireless communication systems. The wireless communication system is widely deployed to provide a variety of communication services, such as voices, packet data, etc. The technology may be used for downlink or uplink. Downlink refers to communication from a base station (BS) to a user equipment (UE), and uplink refers to communication from the UE to the BS. The BS generally refers to a fixed station that communicates with the UE and may be called another terminology, such as a node-B, a base transceiver system (BTS), an access point (AP), etc. The UE may be fixed or mobile and may be referred to as another terminology, such as a mobile station (MS), a user terminal (UT), a subscriber station (SS), a wireless device, etc. In the downlink, a transmitter may be a part of the BS, and a receiver may be a part of the UE. In the uplink, a transmitter may be a part of the UE, and a receiver may be a part of the BS.

The techniques described herein can be used in various wireless communication systems such as code division multiple access (CDMA), frequency division multiple access (FDMA), time division multiple access (TDMA), orthogonal frequency division multiple access (OFDMA), single carrier frequency division multiple access (SC-FDMA), etc. The CDMA can be implemented with a radio technology such as universal terrestrial radio access (UTRA) or CDMA-2000. The TDMA can be implemented with a radio technology such as global system for mobile communications (GSM)/general packet ratio service (GPRS)/enhanced data rate for GSM evolution (EDGE). The OFDMA can be implemented with a radio technology such as institute of electrical and electronics engineers (IEEE) 802.11 (Wi-Fi), IEEE 802.16 (WiMAX), IEEE 802.20, evolved UTRA (E-UTRA), etc. The UTRA is a part of a universal mobile telecommunication system (UMTS). 3rd generation partnership project (3GPP) long term evolution (LTE) is a part of an evolved UMTS (E-UMTS) using the E-UTRA. The 3GPP LTE uses the OFDMA in downlink and uses the SC-FDMA in uplink.

For clarity, the following description focuses on the IEEE 802.16. However, the technical features of the present invention are not limited thereto.

Figure 1:
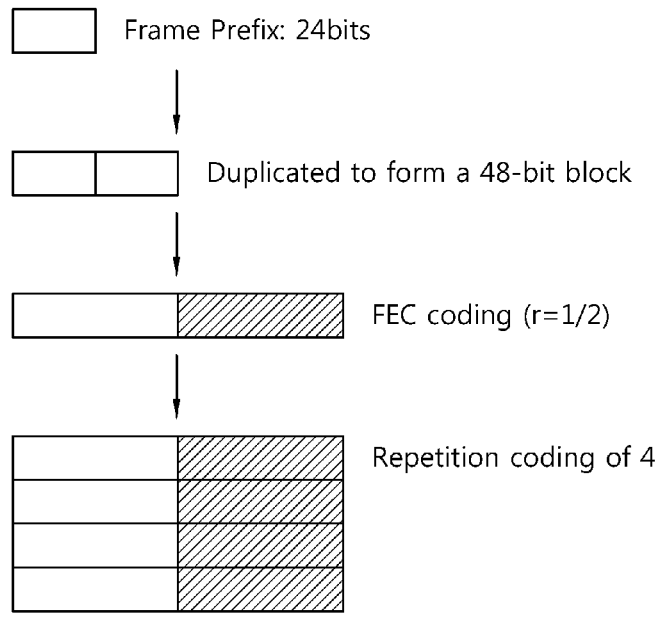
FIG. 1 illustrates an encoding process of the frame prefix based on the IEEE 802.16-2004 standards.
Figure 2:
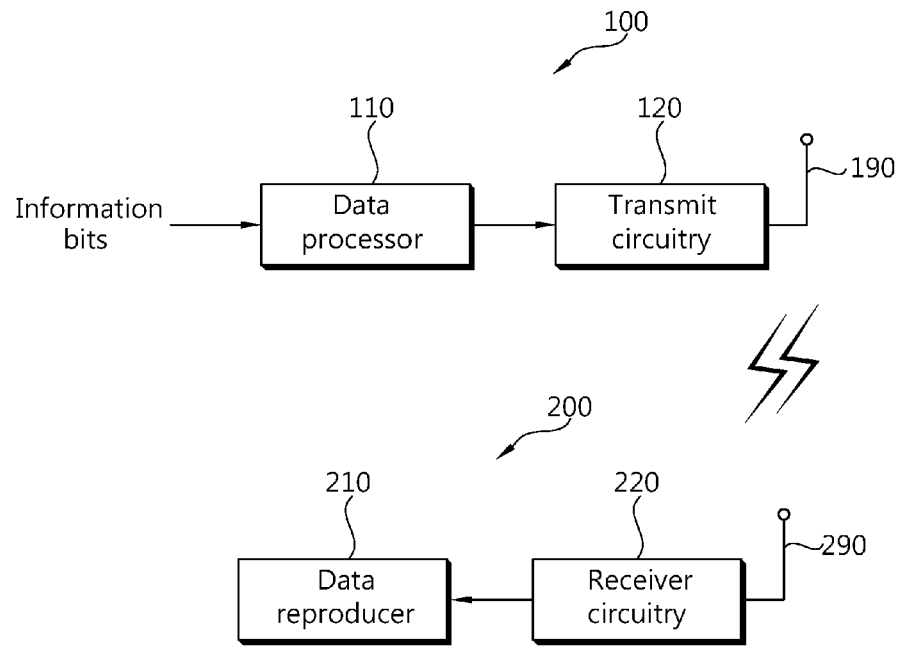
FIG. 2 is a schematic block diagram showing a transmitter and a receiver according to an embodiment of the present invention.

FIG. 2 is a schematic block diagram showing a transmitter and a receiver according to an embodiment of the present invention.

With reference to FIG. 2, a transmitter 100 includes a data processor 110 and a transmit circuitry 120. The data processor processes input information bits to form a transport block. The transmit circuitry 120 maps the transport block to a physical layer, converts it into a radio signal, and transmits the same via a transmit antenna 190.

A receiver 200 includes a data reproducer 210 and a receive circuitry 220. A signal received from a receive antenna 290 is converted into digital data via the receiver circuitry 220, and the data reproducer 210 performs a reverse process corresponding to that of the data processor 110 to restore the original data.

Figure 3:
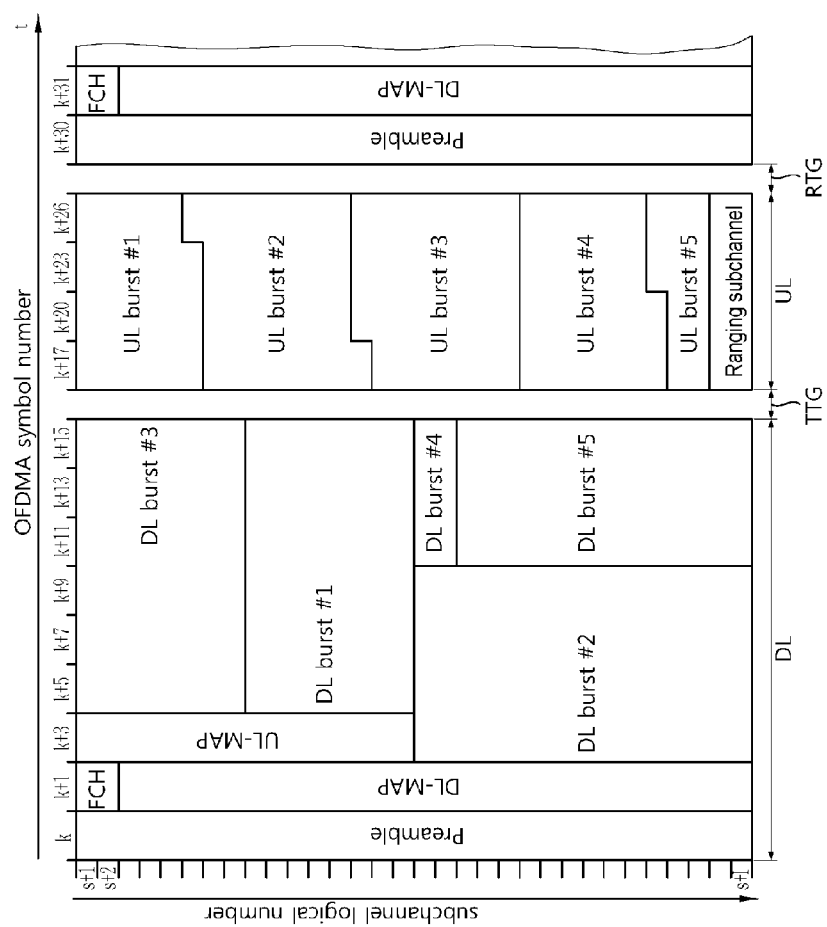
FIG. 3 illustrates an example of a frame structure.

FIG. 3 shows an example of a frame structure. The frame is a data sequence during a fixed time period used by physical specifications. It may refer to the paragraph 8.4.4.2 of "Part 16: Air Interface for Fixed Broadband Wireless Access Systems" of IEEE standards 802.16-2004.

With reference to FIG. 3, the frame includes a downlink (DL) frame and an uplink (UL) frame. Time division duplex (TDD) refers to a scheme in which uplink and downlink transmissions share the same frequency but occur at each different time. The downlink frame temporally goes ahead of the uplink frame. The downlink frame includes a preamble, a frame control header (FCH), a DL (Downlink)-MAP, a UL (Uplink)-MAP, and burst regions, starting in this order. A guard time for discriminating the uplink frame and the downlink frame is inserted into a middle portion of the frame (i.e., between the downlink frame and the uplink frame) and into a final portion (after the uplink frame). A transmit/receive transition gap (TTG) refers to a gap between a downlink burst and a subsequent uplink burst. A receive/transmit transition gap (RTG) refers to a gap between the uplink burst and a subsequent downlink burst.

The preamble is used for initial synchronization between a base station and a UE, cell search, frequency offset, and channel estimation. The FCH is a region to which a frame prefix including information about the length of a DL-MAP message and coding information of the DL-MAP message is mapped. The frame prefix is transmitted via an FCH.

The DL-MAP is a region on which the DL-MAP message is transmitted. The DL-MAP message defines an access of a downlink channel. The DL-MAP message includes a configuration change count of a DCD (Downlink Channel Descriptor) and a base station ID (Identifier). The DCD describes a downlink burst profile applied to a current map. The downlink burst profile refers to the characteristics of a downlink physical channel, and the DCD is periodically transmitted by the base station via a DCD message.

The UL-MAP is a region on which a UL-MAP message is transmitted. The UL-MAP message defines an access of an uplink channel. The UL-MAP message includes a configuration change count of a UCD (Uplink Channel Descriptor) and a valid start time of uplink allocation defined by the UL-MAP. The UCD describes an uplink burst profile. The uplink burst profile refers to the characteristics of an uplink physical channel, and the UCD is periodically transmitted by the base station via a UCD message.

Hereinafter, a slot is a minimum available data allocation unit and defined as time and a subchannel. The number of subchannels depends upon the size of FFT and time-frequency mapping. Subchannels include a plurality of subcarriers. The number of sub-carriers per subchannel differs depending on permutations. Permutation refers to mapping of a logical subchannel to a physical subcarrier. In full usage of subchannels (FUSC), a subchannel includes 48 subcarriers, and in a partial usage of subchannels (PUSC), a subchannel includes 24 or 16 subcarriers. A segment refers to at least one subchannel set.

Data of a physical layer is mapped to a physical subcarrier through two steps. In a first step, data is mapped to at least one data slot in at least one logical subchannel. In a second step, each logical subchannel is mapped to physical subcarriers. This is called permutation. The IEEE 802.16-2004 standards disclose permutations such as FUSC, PUSC, O-FUSC (Optional-FUSC), O-PUSC (Optional-PUSC), AMC (Adaptive Modulation and Coding), and the like. A set of OFDM symbols using the same permutation is called a permutation zone, and a single frame includes at least one permutation zone.

The FUSC and the O-FUSC are used only for downlink transmission. The FUSC includes a single segment including every subchannel group. Each subchannel is mapped to a physical subcarrier distributed in the entire physical channels. This mapping changes for each OFDM symbol. A slot includes a single subchannel in a single OFDM symbol. The O-FUSC has a different pilot allocation scheme from that of the FUSC.

The PUSC is used for both downlink transmission and uplink transmission. In downlink, respective physical channels are divided into clusters each having 14 contiguous subcarriers in two OFDM symbols. The physical channels are mapped to six groups. In each group, pilot is allocated to each cluster and is in a fixed position. In uplink, the subcarriers may be divided into tiles including four contiguous physical subcarriers on three OFDM symbols. Each subchannel includes six tiles. Pilot is allocated to corners of each tile. The O-PUSC is used only for uplink transmission, and each tile includes three contiguous physical subcarriers on three OFDM symbols. Pilot is allocated to the center of tiles.

Figure 4:
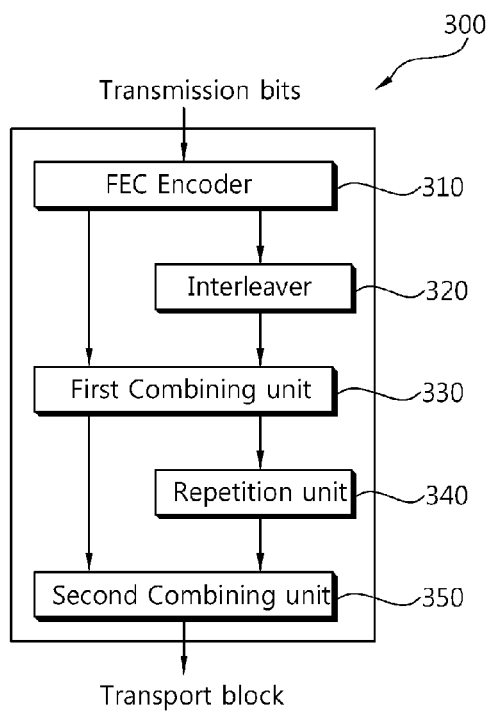
FIG. 4 is a schematic block diagram showing a data processing apparatus according to an embodiment of the present invention.

FIG. 4 is a schematic block diagram showing a data processing apparatus according to an embodiment of the present invention.

With reference to FIG. 4, a data processing apparatus 300 includes a forward error correction (FEC) encoder 310, an interleaver 320, a first combining unit 330, a repetition unit 340, and a second combining unit 350.

The FEC encoder 310 encodes transmission bits by using an FEC code to generate a codeword. The FEC code may support a sufficiently low code rate. As the FEC code, a convolutional code, a block code, a simplex code, a block turbo code, a convolutional turbo code, and the like, may be used. If the length of the transmission bits is within tens of bits, the convolutional code may be used.

The interleaver 320 interleaves a portion or the entirety of the codeword outputted from the FEC encoder 310 to generate an interleaved code. The first combining unit 330 combines a portion or the entirety of the codeword outputted from the FEC encoder 310 and a portion or the entirety of the interleaved code outputted from the interleaver 320 to generate a first combined code. There is no limitation in a combining rate and combining order used by the first combining unit 330 to combine the codeword and the interleaved code, and the combining rate and combining order may vary according to systems.

The repetition unit 340 generates a repeated code by repeating the portion or the entirety of the first combined code outputted from the first combining unit 330. The repetition unit 340 may repeat the first combined code multiple times. The length of the repeated code may be integer multiple of the length of the repeated portion of the first combined code. Additionally, after repeating the portion or the entirety of the first combined code, the circular portion of the first combined code may be added to the repeated code.

The second combining unit 350 combines a portion or the entirety of the first combined code and a portion or the entirety of the repeated code to generate a transport block. The transport block is mapped to physical resources and is transmitted. There is no combining rate and combining order used by the second combining unit 350 to combine the first combined code and the repeated code, and the combining rate and combining order may vary according to systems.

Codeword rearranged by the interleaver 320 and the repeated code obtained by the repetition unit 340 may be combined to lower an error rate of information bits, as necessary.

Transmission bits which are processed by the data processing apparatus 300 may represent any type of information. For example, the transmission bits may be used to represent control information such as a channel quality indicator (CQI), a ACK/NACK signal for hybrid automatic repeat request (HARM), a scheduling request, resource allocation, etc. The control information may be uplink control information or downlink control information. The CQI represents downlink channel condition. The CQI may be an index selected from a modulation and coding scheme (MCS) table. The CQI may include a precoding matrix indicator (PMI) and/or a rank indicator (RI). The scheduling request which is transmitted by a UE is used to request uplink radio resources. The scheduling request may also be referred to as a random access preamble, a bandwidth request, etc. The resource allocation may be uplink radio resource allocation and/or downlink radio resource allocation.

For clarity, a frame prefix which is downlink control information is considered as transmission bits. But the present inventive concept is not limited thereto. Information in a DL-MAP and/or a UL-MAP may also be processed by the data processing apparatus 300.

Figure 5:
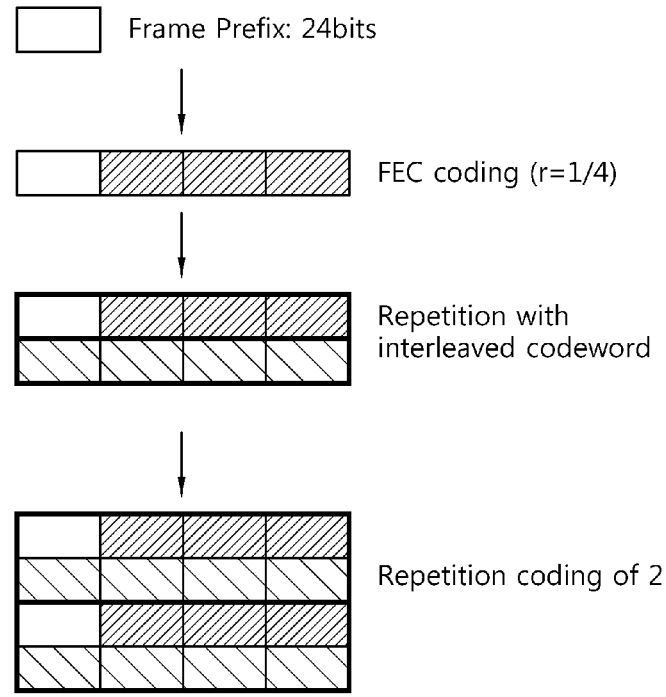
FIG. 5 illustrates a data processing method according to an embodiment of the present invention.

FIG. 5 illustrates a data processing method according to an embodiment of the present invention.

With reference to FIG. 5, a frame prefix, control information, is considered as transmission bits to be transmitted. Below Table 1 shows an example of a format of a 24-bit frame prefix including coding-related information of a DL-MAP message.

TABLE 1

| Syntax | Size (bit) | Notes |
|---|---|---|
| DL_Frame_Prefix_Format( ) { | — | — |
| Used subchannel bitmap | 6 | Bit #0: Subchannel group 0 |
| | | Bit #1: Subchannel group 1 |
| | | Bit #2: Subchannel group 2 |
| | | Bit #3: Subchannel group 3 |
| | | Bit #4: Subchannel group 4 |
| | | Bit #5: Subchannel group 5 |
| Reserved | 1 | Shall be set to zero |
| Repetition_Coding_Indication | 2 | 0b00: No repetition coding on DL-MAP |
| | | 0b01: Repetition coding of 2 used on DL-MAP |
| | | 0b10: Repetition coding of 4 used on DL-MAP |
| | | 0b11: Repetition coding of 6 used on DL-MAP |
| Coding_Indication | 3 | 0b000: CC encoding used on DL-MAP |
| | | 0b001: BTC encoding used on DL-MAP |
| | | 0b010: CTC encoding used on DL-MAP |
| | | 0b011: ZT CC encoding used on DL-MAP |
| | | 0b100: CC encoding with optional interleaver |
| | | 0b101: LDPC encoding used on DL-MAP |
| | | 0b110 to 0b111: Reserved |
| DL-Map_Length | 8 | — |
| Reserved | 4 | Shall be set to zero |
| } | — | — |

A used subchannel bitmap field is a bit map indicating subchannel groups used for a PUSC zone. A Repetition_Coding_Indication field indicates repetition codes used on DL-MAP. A Coding_Indication field indicates FEC encodings used on DL-MAP. In general, the DL-MAP is transmitted through QPSK (Quadrature Phase Shift Keying) modulation of a 1/2 code rate. A DL-MAP_Length field defines a slot unit length of a burst including a DL-MAP message subsequent to the FCH.

Here, the 24-bit frame prefix is considered as the control information, but it is merely illustrative. It is understood by the person in the art that the technical idea of the present invention can be applicable to various control information of different lengths.

First, FEC coding is performed on the 24-bit frame prefix to generate a codeword. If a code rate is ¼, the size of the codeword would be 96 bits.

The codeword is interleaved, and the original codeword and the interleaved codeword are combined. Accordingly, the size of the combined codes is 192 bits. Here, the interleaved codeword is subsequently combined to the original codeword, but it is merely illustrative and the combining rate and/or combining order may change.

The combined codes are repeated two times to generate a transport block. Because the size of the combined codes is 192, the size of the transport block is 384 bits. The transport block is mapped to the FCH so as to be transmitted via a physical channel.

Figure 6:
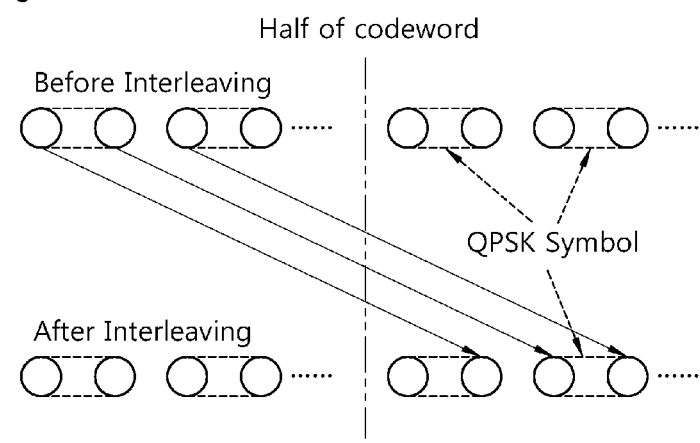
FIG. 6 illustrates an example of performing interleaving.

FIG. 6 illustrates an example of performing interleaving.

With reference to FIG. 6, if it is assumed that the codeword is QPSK-modulated, two bits are paired to form a QPSK symbol. The QPSK symbols constituting the codeword are interleaved such that after they are interleaved, they become different QPSK symbols on constellation. For example, the bits constituting the codeword are divided into two parts (namely, front and rear bits), respectively, and the front bit is interleaved to become the rear bit. In this case, the pairs of bits are shifted one by one so that the QPSK symbols before interleaving and those after interleaving may differ.

Here, the QPSK modulation is illustrative, but the person in the art can easily apply the present invention to any higher modulation order such as a 8-QAM (Quadrature Amplitude Modulation) in which three bits are paired, and 16-QAM in which four bits are paired.

Figure 7:
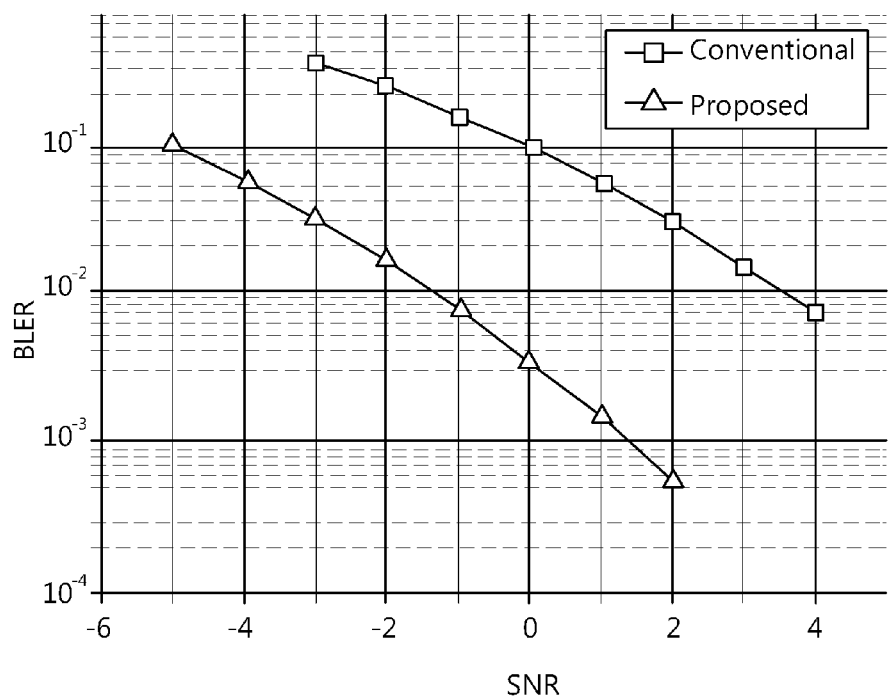
FIG. 7 is a graph showing comparison of performance with conventional art.

FIG. 7 is a graph showing comparison of performance with conventional art, in which convolutional codes are used as the FEC codes, and block error rates (BLERs) according to a signal-to-noise ratio (SNR) are compared.

With reference to FIG. 7, although the same amount of resources as that of conventional art is used, the performance can be improved by about 5 dB compared with the related art. In addition, the amount of input information of the FEC codes to be encoded is reduced to ½ and a simpler decoding method can be used, compared with the related art. By using the interleaving method as shown in FIG. 6, the present invention can be implemented with a smaller capacity of memory and can obtain a similar performance effect as that of a channel interleaver.

All the functions as described above can be performed by processors such as a micro-processor, a controller, a micro-controller, an application specific integrated circuit (ASIC), and the like, according to software coded to perform the functions or program codes. It would be understood that designing, developing and implementing of such codes are obvious to the person in the art based on the description of the present invention.

The preferred embodiments of the present invention have been described with reference to the accompanying drawings, and it will be apparent to those skilled in the art that various modifications and variations can be made in the present invention without departing from the scope of the invention. Thus, it is intended that any future modifications of the embodiments of the present invention will come within the scope of the appended claims and their equivalents.

The invention claimed is:

1. A method for transmitting control information in a wireless communication system, the method comprising:
performing forward error correction (FEC) encoding on control information to generate a codeword;
interleaving a portion or the entirety of the codeword to generate an interleaved code;
combining a portion or the entirety of the codeword and a portion or the entirety of the interleaved code to generate a combined code;
repeating a portion or the entirety of the combined code to generate a repeated code;
combining a portion or the entirety of the combined code and a portion or the entirety of the repeated code to generate a transport block; and
transmitting the transport block,
wherein after repeating the portion or the entirety of the combined code, a circular portion of the combined code is added to the repeated code.

2. The method of claim 1, wherein the transport block is mapped to physical resources.

3. The method of claim 1, wherein the repeated code is generated by repeating the portion or the entirety of the combined code at least two times.

4. The method of claim 1, wherein the control information is uplink control information.

5. The method of claim 1, wherein the control information is downlink control information.

6. A data processing apparatus comprising:
a forward error correction (FEC) encoder configured to encode transmission bits by using an FEC code to generate a codeword;
an interleaver configured to interleave a portion or the entirety of the codeword to generate an interleaved code;
a first combining unit configured to combine a portion or the entirety of the codeword and a portion or the entirety of the interleaved code to generate a first combined code;
a repetition unit configured to generate a repeated code by repeating the portion or the entirety of the first combined code; and
a second combining unit configured to combine a portion or the entirety of the first combined code and a portion or the entirety of the repeated code to generate a transport block,
wherein after the portion or the entirety of the first combined code is repeated, a circular portion of the first combined code is added to the repeated code.

* * * * *